(12) United States Patent
Yun et al.

(10) Patent No.: US 11,466,124 B2
(45) Date of Patent: *Oct. 11, 2022

(54) POLYIMIDE PRECURSOR COMPOSITION AND POLYIMIDE FILM USING SAME

(71) Applicant: LG CHEM, LTD., Seoul (KR)

(72) Inventors: Cheolmin Yun, Daejeon (KR); Kyungjun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 573 days.

This patent is subject to a terminal disclaimer.

(21) Appl. No.: 16/474,766

(22) PCT Filed: Jul. 9, 2018

(86) PCT No.: PCT/KR2018/007733
§ 371 (c)(1),
(2) Date: Jun. 28, 2019

(87) PCT Pub. No.: WO2019/054612
PCT Pub. Date: Mar. 21, 2019

(65) Prior Publication Data
US 2019/0345288 A1 Nov. 14, 2019

(30) Foreign Application Priority Data
Sep. 14, 2017 (KR) .................. 10-2017-0117989

(51) Int. Cl.
*C08G 73/10* (2006.01)
*C08J 5/18* (2006.01)
*H01L 27/12* (2006.01)

(52) U.S. Cl.
CPC .............. *C08G 73/106* (2013.01); *C08J 5/18* (2013.01); *H01L 27/1218* (2013.01); *C08J 2379/08* (2013.01); *H01L 27/1225* (2013.01)

(58) Field of Classification Search
CPC ........ C08G 73/106; C08J 2379/08; C08J 5/18
See application file for complete search history.

(56) References Cited

U.S. PATENT DOCUMENTS

| | | | | |
|---|---|---|---|---|
| 4,395,527 | A * | 7/1983 | Berger | C08G 77/455 528/26 |
| 4,950,728 | A | 8/1990 | Barthelemy et al. | |
| 8,193,295 | B2 | 6/2012 | Sunaga et al. | |
| 8,445,621 | B2 * | 5/2013 | Sunaga | C08L 79/08 528/38 |
| 10,544,266 | B2 | 1/2020 | Yun et al. | |
| 10,647,883 | B2 | 5/2020 | Yun et al. | |
| 2002/0016438 | A1 * | 2/2002 | Sugo | C08G 73/106 528/332 |
| 2008/0107901 | A1 | 5/2008 | Kosuge et al. | |
| 2009/0088551 | A1 | 4/2009 | Yamashita et al. | |
| 2017/0066883 | A1 | 3/2017 | Miyamoto et al. | |
| 2017/0096530 | A1 | 4/2017 | Yun et al. | |
| 2017/0137571 | A1 | 5/2017 | Nakayama et al. | |
| 2020/0245614 | A1 | 8/2020 | Maekawa | |

FOREIGN PATENT DOCUMENTS

| | | |
|---|---|---|
| CN | 106133025 A | 11/2016 |
| CN | 106674027 A | 5/2017 |
| CN | 106928707 A | 7/2017 |
| CN | 107001681 A | 8/2017 |
| EP | 3266808 A1 | 1/2018 |
| JP | 2003-156863 A | 5/2003 |
| JP | 2006-342310 A | 12/2006 |
| JP | 3862267 B2 | 12/2006 |
| JP | 2009-007580 A | 1/2009 |
| JP | 2011-144217 A | 7/2011 |
| JP | 2017-119868 A | 7/2017 |
| JP | 2017-524040 A1 | 8/2017 |
| KR | 10-0082265 B1 | 2/1995 |
| KR | 10-2010-0057810 A | 6/2010 |
| KR | 10-2013-0080432 A | 7/2013 |
| KR | 10-2016-0067413 A | 6/2016 |
| KR | 10-2016-0097685 A | 8/2016 |
| KR | 10-2016-0108252 A | 9/2016 |
| KR | 10-2017-0057458 A | 5/2017 |
| KR | 10-1840977 B1 | 3/2018 |
| TW | 201540747 A | 11/2015 |
| TW | 201609969 A | 3/2016 |
| WO | 2013-047451 A1 | 4/2013 |
| WO | 2014-098235 A1 | 6/2014 |
| WO | 2015-183056 A1 | 12/2015 |
| WO | 2015-198970 A1 | 12/2015 |
| WO | WO 2016140559 A1 * | 9/2016 ........... C08G 73/125 |
| WO | 2019-087796 A1 | 5/2019 |

OTHER PUBLICATIONS

European Search Report issued for European Patent Application 18 856 647.5 dated Mar. 18, 2020, 6 pages.
International Search Report issued for International Application No. PCT/KR2018/007733 dated Oct. 24, 2018, 4 pages.

\* cited by examiner

*Primary Examiner* — Jane L Stanley (74) *Attorney, Agent, or Firm* — Rothwell, Figg, Ernst & Manbeck, P.C.

(57) ABSTRACT

A polyimide precursor composition according to the present invention enables alleviation of thermal expansion-contraction properties of a polyimide film resultingly prepared, by means of using siloxane-based diamine having a particular structure and a solvent having a positive partition coefficient. And the present invention enables excellent transparency, heat resistance, mechanical strength and flexibility and effective reduction of residual stress, and thus can be used in various fields such as a substrate for a device, a cover substrate for a display, an optical film, an integrated circuit (IC) package, an adhesive film, a multi-layer flexible printed circuit (FPC), tape, a touch panel and a protective film for an optical disk.

12 Claims, 2 Drawing Sheets

FIG. 1 (a)

Relaxation segment

Relaxation segment

Continuous phase

FIG. 1 (b)

Relaxation segment

Low block length

Relaxation segment

High block length

[FIG. 2]

POLYIMIDE PRECURSOR COMPOSITION AND POLYIMIDE FILM USING SAME

This application is a 35 U.S.C. § 371 National Phase Entry application from PCT/KR2018/007733, filed on Jul. 9, 2018, and designating the United States, which claims the benefit of priority to Korean Patent Application No. 10-2017-0117989, filed on Sep. 14, 2017, the entire disclosure of which is incorporated herein by reference.

TECHNICAL FIELD

The present invention relates to a polyimide precursor composition for preparing a polyimide film with low phase difference and high heat resistance to alleviate the thermal expansion-shrinkage behavior thereof.

BACKGROUND ART

Polyimide (PI) is a polymer having a relatively low crystallinity or mostly non-crystalline structure, which has an advantage that it is easy to synthesize, it can be formed to a thin film and it does not require a crosslinking agent for cure. Also, polyimide is a polymeric material that has excellent heat resistance and chemical resistance, excellent mechanical properties, electrical properties and dimensional stability due to its rigid chain structure in addition to its transparency. Therefore, it is widely used as electrical and electronic materials for automobiles, aerospace, flexible circuit boards, liquid crystal alignment films for LCDs, and adhesives and coatings.

Although the polyimide is a high performance polymer with excellent thermal stability, mechanical properties, chemical resistance and electrical properties, it does not satisfy the basic requirements for the display area such as colorless transparency, and its thermal expansion coefficient should be further lowered. For example, KAPTON sold by DuPont has a low thermal expansion coefficient of about 30 ppm/° C., but it also does not meet requirements for a plastic substrate. Therefore, there are many studies to minimize the change of optical characteristics and thermal history while maintaining the basic characteristics of polyimide. In general, an aromatic polyimide has unique color of dark brown as electrons can be excited due to 6 electrons, 7E electrons, nonbonding unshared electron pairs within the imide structure, and it can be explained by the theory of charge transfer complex (hereinafter, called CT-complex) induced by 7E electrons of benzene within a main chain of the polyimide.

Conventional polyimides absorb light in a visible wavelength ranging from 400 nm to 500 nm, and therefore they show complementary color of yellow to red. In order to lower the CT-complex that is a disadvantage of the polyimide, a method of introducing an electron-withdrawing functional group having relatively strong electronegativity such as trifluoromethyl (—$CF_3$), sulfone (—$SO_2$) and ether (—O—) into the main chain of the polyimides is used to lower resonance effect by limiting the movement of 7E electron. Also, the introduction of a cyclo-olefin structure, instead of benzene, to the main chain of the polyimide can reduce the density of 7E electrons to prepare a colorless transparent polyimide film.

Meanwhile, a polyamide-imide has been widely used as an industrial material in the electrical, mechanical, electronic and aerospace fields due to its excellent properties such as heat resistance, mechanical strength and electrical property. Also, the polyamide-imide has a structure different from the conventional polyimide and is known to be soluble in an organic solvent, allowing for the application which requires solution casting, such as an enamel varnish, a coating agent for electrical insulation and a paint.

However, for the application in the display area, it is still required to develop a polymer for a flexible display having a lower thermal expansion coefficient, as well as high solubility, transparency and thermal stability.

DETAILED DESCRIPTION OF THE INVENTION

Technical Problem

The present invention is designed to solve the problems of the related art, and thus, it is an aspect of the present invention to provide a polyimide precursor composition for preparing a polyimide film with low phase difference and high heat resistance to alleviate the thermal expansion-shrinkage behavior thereof.

It is other aspect of the present invention to provide a polyimide film prepared from the polyimide precursor composition.

It is another aspect of the present invention to provide a flexible display device comprising the polyimide film.

Technical Solution

In order to accomplish the above aspect, the present invention provides a polyimide precursor composition, which comprises an acid dianhydride, a diamine and a dimethylsiloxane (DMS)-diphenylsiloxane (DPS) oligomer of Formula 1 as polymerization components, and an organic solvent having a positive value of partition coefficient (log P) at 25° C. and a density of 1 $g/cm^3$ or less:

[Formula 1]

wherein, p and q are each a molar fraction, and p ranges from 70 to 90 and q ranges from 10 to 30 when the sum of p and q is 100.

In a preferred embodiment, the organic solvent may be an amide-based solvent, specifically may be selected from dimethylpropionamide (DMPA) and diethylpropionamide (DEPA).

In one embodiment, the dimethylsiloxane (DMS)-diphenylsiloxane (DPS) oligomer may have a molecular weight of 4,000 g/mol or more.

In one embodiment, the acid dianhydride may be selected from tetracarboxylic dianhydrides containing a tetravalent organic group of Formulas 2a to 2h:

[Formula 2a]

-continued

[Formula 2b]

[Formula 2c]

[Formula 2d]

[Formula 2e]

[Formula 2f]

[Formula 2g]

[Formula 2h]

wherein,

$R_{11}$ to $R_{24}$ are each independently a substituent selected from a halogen atom selected from the group consisting of —F, —Cl, —Br and —I, hydroxyl (—OH), thiol (—SH), nitro (—NO$_2$), cyano, C$_{1-10}$ alkyl, C$_{1-4}$ halogenoalkoxyl, C$_{1-10}$ halogenoalkyl, and C$_{6-20}$ aryl, a1 is an integer of 0 to 2, a2 is an integer of 0 to 4, a3 is an integer of 0 to 8, a4 and a5 are each independently an integer of 0 to 3, and a7 and a8 are each independently an integer of 0 to 3, a10 and a12 are each independently an integer of 0 to 3, a11 is an integer of 0 to 4, a15 and a16 are each independently an integer of 0 to 4, a17 and a18 are each independently an integer of 0 to 4, and a6, a9, a13, a14, a19 and a20 are each independently an integer of 0 to 3, n is an integer of 1 to 3, and $A_{11}$ to $A_{16}$ are each independently selected from the group consisting of —O—, —CR'R"—, —C(=O)—, —C(=O)O—, —C(=O)NH—, —S—, —SO$_2$—, phenylene and a mixture thereof, in which R' and R" are each independently selected from the group consisting of hydrogen, C$_{1-10}$ alkyl, and C$_{1-10}$ fluoroalkyl.

In one embodiment, the diamine may comprise a compound having the structure of Formula 3 in an amount of 80 to 99 mol %, based on the total amount of the diamines:

[Formula 3]

wherein,

$R_{31}$ and $R_{32}$ are each independently a substituent selected from a halogen atom selected from the group consisting of —F, —Cl, —Br and —I, hydroxyl (—OH), thiol (—SH), nitro (—NO$_2$), cyano, C$_{1-10}$ alkyl, C$_{1-4}$ halogenoalkoxyl, C$_{1-10}$ halogenoalkyl, and C$_{6-20}$ aryl, and Q is selected from the group consisting of a single bond, —O—, —CR'R"—, —C(=O)—, —C(=O)O—, —C(=O)NH—, —S—, —SO$_2$—, phenylene and a mixture thereof, in which R' and R" are each independently selected from the group consisting of hydrogen, C$_{1-10}$ alkyl, and C$_{1-10}$ fluoroalkyl.

In one embodiment, the tetracarboxylic dianhydrides may comprise a compound having the structure of Formula 4 in an amount of 20 to 80 mol %, based on the total amount of the tetracarboxylic dianhydrides:

[Formula 4]

In one embodiment, the tetracarboxylic dianhydrides may comprise a compound having the structure of Formula 5 in an amount of 20 to 80 mol %, based on the total amount of the tetracarboxylic dianhydridess:

[Formula 5]

wherein, $Q_1$ and $Q_2$ are each independently selected from the group consisting of a single bond, —O—, —C(=O)—, —C(=O)O—, —C(=O)NH—, —S—, —SO$_2$—, phenylene and a mixture thereof.

In one embodiment, the acid dianhydrides may comprise both tetracarboxylic dianhydrides of Formula 4 and Formula 5:

[Formula 4]

[Formula 5]

wherein, $Q_1$ and $Q_2$ are each independently selected from the group consisting of a single bond, —O—, —C(=O)—, —C(=O)O—, —C(=O)NH—, —S—, —SO$_2$—, phenylene and a mixture thereof.

In order to accomplish the other aspect, the present invention also provides a polyimide film prepared from the polyimide precursor composition.

In one embodiment, the polyimide film may have a haze of 2 or less.

In one embodiment, the polyimide film may have a Tg of 350° C. or higher.

In one embodiment, the polyimide film may have a CTE of 100 ppm/° C. or less.

Further, the present invention provides a transparent polyimide substrate for an oxide TFT or LTPS prepared from the polyimide precursor composition.

Advantageous Effects

According to the present invention, in the presence of an organic solvent having a positive value of partition coefficient (log P), polymerization components comprising a DMS-DPS oligomer having a high molecular weight of siloxane structure are brought into polymerizing and curing to prepare a polyimide copolymer in which the nano-sized DMS-DPS is dispersed with a continuous phase to maintain heat resistance and mechanical properties and effectively reduce residual stress. Thus, the polyimide according to the present invention has high heat resistance and low stress being useful as a polymer material and can be used in various fields such as a substrate for a device, a cover substrate for a display, an optical film, an integrated circuit (IC) package, an adhesive film, a multi-layered flexible printed circuit (FPC), a tape, a touch panel and a protection film for an optical disk.

Hereinafter, the present invention will be described in detail with reference to the accompanying drawings which illustrate a preferable example of the present invention for the purpose of better explanation, not intended to limit the technical scope of the invention. It will be obvious to those skilled in the art that various changes and modifications may be made without departing from the spirit and scope of the invention. In the following description, well-known functions or constructions would not be described in detail if they may obscure the point of the invention.

As used herein, all compounds or organic groups may be substituted or unsubstituted, unless particularly stated otherwise herein. The term "substituted" means that at least one hydrogen contained in the compound or organic group is substituted with a halogen atom, an alkyl group having 1 to 10 carbon atoms, a halogenated alkyl group, a cycloalkyl group having 3 to 30 carbon atoms, an aryl group having 6 to 30 carbon atoms, an alkoxy group having 1 to 10 carbon atoms, a carboxyl group, an aldehyde group, an epoxy group, a cyano group, a nitro group, an amino group, and a derivative thereof.

Further, unless particularly stated otherwise herein, the term 'combination thereof' means that two or more functional groups are bonded by a single bond, a double bond, a triple bond or a linking group such as a $C_{1-10}$ alkylene group (e.g., methylene group (—CH$_2$), ethylene group (—CH$_2$CH$_2$—), etc.), a $C_{1-10}$ fluoroalkylene group (e.g., fluoromethylene group (—CF$_2$—), a perfluoroethylene group (—CF$_2$CF$_2$—), etc.), a hetero atom such as N, O, P, S or Si, or a functional group containing the same (e.g., intramolecular carbonyl group (—C=O—), ether group (—O—), ester group (—COO—), heteroalkylene group containing —S—, —NH—, —N=N—, etc.), or two or more functional groups are connected by condensation.

Flexible devices with a high temperature process require heat resistance at high temperature, and particularly, in the case of an organic light emitting diode (OLED) device using oxide TFT and low temperature polycrystalline silicon (LTPS) processes, the process temperature sometimes comes to 350° C. or higher, close to 500° C.

At this temperature, even polyimides with excellent heat resistance are easily pyrolyzed, and may be shrunk or expanded by heat. Accordingly, in order to manufacture flexible devices, it is needed to develop polyimides which can exhibit excellent thermal stability while maintaining high transparency at high temperature, together with enough mechanical properties.

The present invention provides a polyimide precursor composition, which comprises acid dianhydrides, diamines and a dimethylsiloxane (DMS)-diphenylsiloxane (DPS) oligomer of Formula 1 as polymerization components, and an organic solvent having a positive value of partition coefficient (log P) at 25° C. and a density of 1 g/cm$^3$ or less:

[Formula 1]

wherein, p and q are each a molar fraction, and p ranges from 70 to 90 and q ranges from 10 to 30 when the sum of p and q is 100.

In a preferred embodiment, the organic solvent may be an amide-based solvent, specifically may be selected from dimethylpropionamide (DMPA) and diethylpropionamide (DEPA).

In addition to the above solvent, at least one selected from the group consisting of N,N-diethylacetamide (DEAc), N,N-diethylformamide (DEF) and N-ethylpyrrolidone (NEP) may be used together.

The polyimide copolymer according to the present invention can be obtained by using the organic solvent as described above to reduce white turbidity which may be generated by phase separation due to polarity difference between the flexible polyimide repeating unit with the structure of Formula 1 and other polyimide repeating unit with different structure. In the prior art, two types of solvents have been used to solve the phase separation. However, the present invention can reduce white turbidity only by using one kind of organic solvent, and thus a more transparent polyimide film can be produced.

According to the present invention, a diamine oligomer containing an Si structure with a high molecular weight is used together with an acid dianhydride in an organic solvent having a positive value of partition coefficient (log P) at 25° C. and a density of 1 g/cm$^3$ or less for polymerization to produce a polyimide, thereby providing a polyimide film which is colorless transparent and has excellent heat resistance to alleviate the thermal expansion-shrinkage behavior.

In one embodiment, the diamine oligomer of Formula 1 may have a molecular weight of 4,000 g/mol or more, preferably 4,400 g/mol or more, more preferably 5,000 g/mol or more. As used herein, the molecular weight refers to a weight average molecular weight and the molecular weight calculation can be performed by a method of calculating an amine equivalent using NMR analysis or acid-base titration.

If the diamine oligomer of Formula 1 has a molecular weight less than 4,000 g/mol, heat resistance may be deteriorated, thereby lowering the glass transition temperature (Tg) of the polyimide prepared or excessively raising coefficient of thermal expansion thereof.

In Formula 1, p and q are each a molar fraction, and p ranges from 70 to 90 and q ranges from 10 to 30 when the sum of p and q is 100. If p is more than 90 and q is less than 10, the compatibility may be deteriorated to generate phase separation and white turbidity in the precursor solution, thereby causing haze in the film prepared. If p is less than 70 and q is more than 30, the effect of reducing residual stress may be lowered.

[Formula 1]

In one embodiment of the present invention, one or more diamines may be used, and the diamine oligomer of Formula 1 may be comprised in an amount of 1 to 20 mol %, preferably 1 to 10 mol % based on the total amount of the diamines.

In one embodiment, the diamine oligomer of Formula 1 may be comprised in an amount of 10 to 50 wt %, preferably 10 to 40 wt % based on the total solid of the polyimide copolymer, i.e., the solid content or the total weight of the polymerization components (diamine and acid dianhydride) in the polyimide precursor. If the diamines comprising the structure of Formula 1 are excessively used, for example, in an amount of more than 50 wt % or more than 40 wt %, the mechanical properties, such as modulus, of the polyimide may be deteriorated and the strength of the film may decrease, and thus physical damages such as tearing of the film may occur during the process. Also, the excessive use of the diamine of Formula 1 may occur Tg derived from the polymer having the siloxane structure. From this, the Tg appears at a low process temperature of 350° C. or lower to cause wrinkles on the surface of the film due to the flow of the polymer during the inorganic film deposition process at 350° C. or higher and cause crack on the inorganic film.

Figure 1:
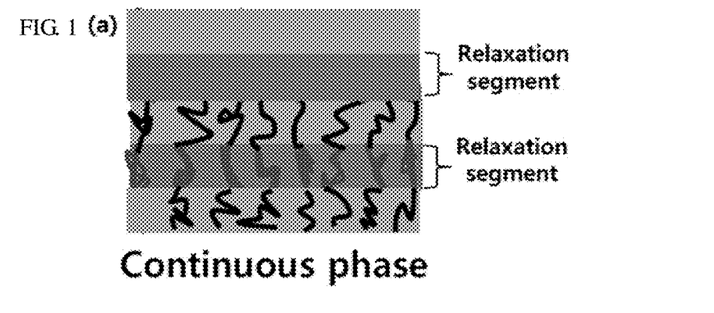
FIGS. 1(a)-(b) schematically show the structure of a copolymer prepared from the precursor composition of the present invention.

FIGS. 1(a)-(b) schematically show the structure of a copolymer prepared from the precursor composition of the present invention.

In the present invention, the diamine of Formula 1 containing a siloxane structure is added in the structure of the polyimide to enhance the modulus strength of the polyimide and alleviate stress by external force. The polyimide having the siloxane structure may have polarity and undergo phase separation due to polarity difference between it and a polyimide having no siloxane structure. This may cause the un-uniform distribution of the siloxane structure in the overall structure of the polyimide. In this case, it is difficult to improve the physical properties such as the strength enhancement and stress relaxation effect of the polyimide due to the siloxane structure, and the transparency of the film may be deteriorated due to the increase of haze due to phase separation. In particular, when the diamine containing a siloxane structure has a high molecular weight, the polyimide prepared from the diamine may be more polar and the phase separation between polyimides may be more clearly observed. However, when a siloxane diamine having a low molecular weight structure as shown in FIG. 1(b) is used, a large amount of siloxane diamine should be added in order to provide stress relaxation effect and the like. This may cause a process problem such as occurrence of Tg at a low temperature to deteriorate the physical properties of the polyimide film. On the contrary, the use of a siloxane diamine having a high molecular weight can form a large relaxation segment in the molecule as shown in FIG. 1(b), thereby effectively providing the stress relaxation effect even at a lowered amount as compared with the case that the siloxane diamine having a low molecular weight is used. Accordingly, the present invention is to uniformly distribute the diamine of formula (1) having a siloxane structure with a higher molecular weight in a polyimide matrix without phase separation.

In the case that a polar solvent and a non-polar solvent is used in combination thereof to solve such a problem, the polar solvent may be subject to volatilization in advance during the process due to its high volatility. This may deteriorate the reproducibility of the process and fails to completely solve phase separation to raise the haze of the polyimide film prepared and lower the transparency thereof.

In order to distribute the polyimide structure containing the diamine of Formula 1 in the whole polyimide matrix, the present invention uses an organic solvent having a positive value of log P, particularly an amine-based solvent having a positive value of log P, more specifically a solvent having an amphiphilic structure to solve the problem of process caused by the use of the polar solvent. Also, even though the solvent having an amphiphilic structure is used alone, it allows the uniform distribution of the polyimide by virtue of its molecular structure with amphiphilic property, and thus can solve the problems caused by phase separation to provide a polyimide having improved haze characteristics.

In one embodiment, the tetracarboxylic dianhydrides may be selected from those containing a tetravalent organic group of Formulas 2a to 2h in the molecular structure thereof:

[Formula 2a]

[Formula 2b]

[Formula 2c]

[Formula 2d]

[Formula 2e]

[Formula 2f]

[Formula 2g]

[Formula 2h]

wherein,

$R_{11}$ to $R_{24}$ are each independently a substituent selected from a halogen atom selected from the group consisting of —F, —Cl, —Br and —I, hydroxyl (—OH), thiol (—SH), nitro (—NO$_2$), cyano, $C_{1-10}$ alkyl, $C_{1-4}$ halogenoalkoxyl, $C_{1-10}$ halogenoalkyl, and $C_{6-20}$ aryl, a1 is an integer of 0 to 2, a2 is an integer of 0 to 4, a3 is an integer of 0 to 8, a4 and a5 are each independently an integer of 0 to 3, and a7 and a8 are each independently an integer of 0 to 3, a10 and a12 are each independently an integer of 0 to 3, a11 is an integer of 0 to 4, a15 and a16 are each independently an integer of 0 to 4, a17 and a18 are each independently an integer of 0 to 4, and a6, a9, a13, a14, a19 and a20 are each independently an integer of 0 to 3, n is an integer of 1 to 3, and $A_{11}$ to $A_{16}$ are each independently selected from the group consisting of —O—, —CR'R"—, —C(=O)—, —C(=O)O—, —C(=O)NH—, —S—, —SO$_2$—, phenylene and a mixture thereof, in which R' and R" are each independently selected from the group consisting of hydrogen, $C_{1-10}$ alkyl, and $C_{1-10}$ fluoroalkyl.

In addition to the diamine of Formula 1, the present invention may further comprise a diamine having the structure of Formula 3 in an amount of 80 to 99 mol %, based on the total amount of the diamines:

[Formula 3]

wherein, $R_{31}$ and $R_{32}$ are each independently a substituent selected from a halogen atom selected from the group consisting of —F, —Cl, —Br and —I, hydroxyl (—OH), thiol (—SH), nitro (—NO$_2$), cyano, $C_{1-10}$ alkyl, $C_{1-4}$ halogenoalkoxyl, $C_{1-10}$ halogenoalkyl, and $C_{6-20}$ aryl, preferably a substituent selected from halogen atom, halogenoalkoxyl, alkyl, aryl and cyano. For example, the halogen atom may be fluorine (—F), the halogenoalkyl may be a $C_{1-10}$ fluoroalkyl containing a fluorine atom and may be selected from fluoromethyl, perfluoroethyl, trifluoromethyl and the like, the alkyl may be selected from methyl, ethyl, propyl, isopropyl, t-butyl, pentyl and hexyl, and the aryl may be selected from phenyl and naphthalenyl. More preferably, the substituent may be a fluoro-based substituent comprising fluorine, a fluoroalkyl group containing fluorine, etc.

Q is selected from the group consisting of a single bond, —O—, —CR'R"—, —C(=O)—, —C(=O)O—, —C(=O)NH—, —S—, —SO$_2$—, phenylene and a mixture thereof, in which R' and R" are each independently selected from the group consisting of hydrogen, $C_{1-10}$ alkyl, and $C_{1-10}$ fluoroalkyl.

As used Herein, the term 'fluoro-based substituent' means not only 'fluorine atom' but also 'a substituent containing a fluorine atom'.

The diamine of Formula 3 may be selected from compounds of Formulas 3a to 3d:

(3a)

-continued wherein, Q has the same meaning as mentioned above.

In one embodiment, the tetracarboxylic dianhydrides may comprise a compound having the structure of Formula 4 in an amount of 20 to 80 mol %, preferably 30 to 80 mol %, more preferably 30 to 70 mol %, based on the total amount of the tetracarboxylic dianhydrides:

[Formula 4]

In one embodiment, the tetracarboxylic dianhydrides may comprise a compound having the structure of Formula 5 in an amount of 20 to 80 mol %, preferably 20 to 60 mol %, more preferably 20 to 50 mol %, based on the total amount of the tetracarboxylic dianhydrides:

[Formula 5]

wherein, $Q_1$ and $Q_2$ are each independently selected from the group consisting of a single bond, —O—, —C(=O)—, —C(=O)O—, —C(=O)NH—, —S—, —SO$_2$—, phenylene and a mixture thereof.

In one embodiment, the structure of Formula 5 may be a compound of Formulas 5a to 5e:

The addition of the fluorene-containing repeating unit in the polyimide structure can reduce retardation in the thickness direction of the film.

In addition to the tetracarboxylic dianhydride of Formula 4 to 5, the present invention may further use at least one selected from tetracarboxylic dianhydrides containing a tetravalent organic group of Formulas 6a to 6r:

In Formula 6l, $A_2$ is selected from the group consisting of a single bond, —O—, —C(=O)—, —C(=O)NH—, —S—, —SO$_2$—, phenylene and a mixture thereof, and v is an integer of 0 or 1. In Formula 6r, x is an integer of 1 to 10.

Also, at least one hydrogen atom present in each of the tetravalent aromatic organic groups of Formulas 6a to 6r may also be substituted with a substituent selected from a halogen atom selected from —F, —Cl, —Br and —I, hydroxyl (—OH), thiol (—SH), nitro (—NO$_2$), cyano, $C_{1-10}$ alkyl, $C_{1-4}$ halogenoalkoxyl, $C_{1-10}$ halogenoalkyl, and $C_{6-20}$ aryl.

In addition, both tetracarboxylic dianhydrides of Formula 4 and Formula 5 may be used in the present invention. When the tetracarboxylic dianhydrides of Formula 4 and Formula 5 are used together, the tetracarboxylic dianhydride of Formula 5 may be used in an amount of 10 to 30 mol %, preferably 10 to 25 mol %, more preferably 15 to 25 mol % based on the total amount of the tetracarboxylic dianhydrides. The compound of Formula 5 containing the fluorene structure is used with the formula of Formula 4 in the preparation of the polyimide to alleviate surface-directed shrinkage by heat, thereby improving the shrinkage of the film which may be generated during a cooling procedure and enhancing heat resistance such as glass transition temperature.

In one embodiment of the present invention, the total tetracarboxylic dianhydrides and the diamines may be brought into reaction in a molar ratio of 1:1.1 to 1.1:1. Preferably, in order to improve the reactivity and the processability, the total amount of the tetracarboxylic dianhydrides may excessively exceed the amount of the diamine, or the amount of the diamines may excessively exceed the total amount of the tetracarboxylic dianhydrides.

In one embodiment of the present invention, the total tetracarboxylic dianhydrides and the diamines may be brought into reaction in a molar ratio of 1:0.99 to 0.99:1, preferably 1:0.98 to 0.98:1.

Also, the organic solvent which is useful in the present invention may have a positive value of partition coefficient (log P) at 25° C., a boiling point of 180° C. or lower and a density of 1 g/cm$^3$ or less. More specifically, the value of partition coefficient (log P) may range from 0.01 to 3, or 0.1 to 2, or 0.5 to 1.5. The partition coefficients (log P) of dimethylpropionamide (DMPA) and diethylpropionamide (DEPA) are 0.504 and 1.275, respectively, and the densities thereof are 0.876 g/cm$^3$ and 0.870 g/cm$^3$, respectively.

The partition coefficient may be calculated using the ACD/Log P module of ACD/Percepta platform (ACD/Labs). The ACD/Log P module uses an algorism for quantitative structure-property relationship (QSPR) based on molecular 2D structure.

The positive value of partition coefficient means the hydrophobic polarity of a solvent. The present inventors have found that when a certain solvent having a positive partition coefficient is used to prepare a polyimide precursor composition, it can improve the drying property of the solvent. Also, the use of a solvent having a positive partition coefficient can control the drying property of the solvent without using an additive such as a leveling agent for controlling the surface tension and the smoothness of the coated film. By avoiding the use of additional additive, it is possible to eliminate the problems that a low molecular weight material is contained in the final product to cause quality damage and process difficulty and to have the effect of forming a polyimide having uniform properties more effectively.

For example, in the process coating the polyimide precursor composition on a glass substrate, the coating solution may be dewetted due to shrinkage of the coated layer when the coating solution is cured or stored under humidity conditions. The dewetting of the coating solution may cause variation in thickness of a film to lack the flexibility of the film, and thus the film may be cut or its edges may be broken when cutting, resulting in poor working performance and reduced yield.

Also, when a fine polar foreign material may be introduced into the polyimide precursor composition coated on the substrate, the polyimide precursor composition comprising a polar solvent with a negative value of log P may sporadically undergo crack generation or thickness change based on the position of the foreign material by the polarity of the foreign material in the coated film, while the polyimide precursor composition comprising a hydrophobic solvent with a positive value of log P can alleviate or inhibit crack generation and thickness change even though the fine polar foreign material is introduced.

Specifically, the polyimide precursor composition comprising a solvent with a positive value of log P may have a dewetting ratio of 0% to 0.1% as defined by the following Equation 1:

$$\text{Dewetting ratio (\%)} = [(A-B)/A] \times 100 \quad \text{[Equation 1]}$$

wherein,

A is an area of the polyimide precursor composition in the state that the polyimide precursor composition was completely coated on the substrate (100 mm×100 mm), B is an area of the polyimide precursor composition or the polyimide (PI) film after the polyimide precursor composition or the polyimide film is dewetted from the end of the coated substrate.

The dewetting phenomenon in polyimide precursor composition or film may occur within 30 minutes after coating of the polyimide precursor composition. Particularly, as the dewetting is started from the edge, the thickness of the edge may increase.

After the polyimide precursor composition according to the present invention is coated on a substrate and then stored for 10 minutes or longer, for example, 10 minutes or longer, for example, 40 minutes or longer under a humidity condition, the dewetting ratio of the coated polyimide precursor composition may be 0.1% or less. For example, even after storing at a temperature of 20° C. to 30° C. and under a humidity condition of 40% or more, more specifically, under a humidity condition of a range from 40% to 80%, i.e., 40%, 50%, 60%, 70% and 80%, respectively, for example, 50%, for 10 to 50 minutes, the dewetting ratio may be very low as 0.1% or less, preferably 0.05%, more preferably near 0%.

Such dewetting ratio is also maintained after curing. For example, after the polyimide precursor composition is coated on a substrate, storing thereof for 10 minutes or longer, for example, at a temperature of 20° C. to 30° C. and under a humidity condition of 40% or more, more specifically, under a humidity condition of a range from 40% to 80%, i.e., 40%, 50%, 60%, 70% and 80%, respectively, for example, storing under a humidity condition of 50% for 10 to 50 minutes and then cured at 320° C. or higher, the dewetting ratio of the polyimide film thus obtained may be 0.1% or less. In other word, there may be little or no dewetting in the curing process by heat-treatment, and specifically, the dewetting ratio may be 0.05%, more preferably near 0%.

The polyimide precursor composition according to the present invention can solve the dewetting phenomenon, thereby providing a polyimide with more uniform characteristics and thus improving the yield of a manufacturing process.

Further, the density of the organic solvent according to the present invention may be measured by a standard measuring method of ASTM D1475, and it may be 1 g/cm$^3$ or less. If the density is more than 1 g/cm$^3$, the relative viscosity may increase and then the process efficiency may be reduced.

The polymerization of the tetracarboxylic dianhydrides and the diamines may be carried out by conventional polymerization methods of a polyimide or its precursor, such as solution polymerization.

Specifically, the polymerization may be carried out by dissolving the diamines in an organic solvent and adding the tetracarboxylic dianhydrides to the resultant mixing solution.

In one embodiment, a method of polymerization may comprise the following steps:

a) adding a diamine oligomer of Formula 1 in an organic solvent;

b) adding a diamine of Formula 3 to a solution obtained in the step a);

c) adding one or more tetracarboxylic dianhydrides to a solution obtained in the step b); and d) bringing a solution obtained in the step c) into polymerization at a predetermined temperature.

The reaction of polymerization may be carried out under an inert gas or nitrogen atmosphere and anhydrous conditions.

Also, the reaction may be carried out at a temperature of −20 to 80° C., preferably 0 to 80° C. If the reaction temperature is too high, the reactivity may be raised and the molecular weight may increase, and the viscosity of the precursor composition may increase, which may be disadvantageous in terms of the process.

The polyimide precursor composition preferably has a solid content to provide a suitable viscosity taking into consideration of processability such as coating property in the formation of a film. In one embodiment, the solid content may range from 8 to 25 wt %, preferably 10 to 25 wt, more preferably 10 to 20 wt % based on the total weight of the polyimide precursor composition.

Also, it is preferred that the polyimide precursor composition has a viscosity of 3,000 cP or more, or 4,000 cP or more. In addition, the viscosity of the polyimide precursor composition may be 10,000 cP or less, preferably 9,000 cP or less, more preferably 8,000 cP or less. If the viscosity of the polyimide precursor composition exceeds 10,000 cP, the process efficiency may be deteriorated due to reduced defoaming efficiency when processing the polyimide film, and also electrical, optical and mechanical properties of the film may be deteriorated due to bad surface profile caused by bubble formation.

Further, the polyimide according to the present invention may have a weight average molecular weight of 10,000 to 200,000 g/mol, 20,000 to 100,000 g/mol or 30,000 to 100,000 g/mol. Further, it is preferred that the polyimide according to the present invention has a molecular weight distribution (Mw/Mn) of 1.1 to 2.5. If the weight average molecular weight or molecular weight distribution of the polyimide is out of the range defined above, it is difficult to form the film or it is apt to deteriorate the characteristics of the polyimide-based film, such as transmittance, heat resistance and mechanical properties.

Then, the polyimide precursor composition obtained by the above method may be subject to imidization. Specifically, the imidization process may be carried out by a chemical imidization method or a thermal imidization method.

For example, the polyimide can be obtained by a imidization method using chemical reaction in which a dehydrating agent and an imidization catalyst are added to the polymerized polyimide precursor solution and then the resulting solution is heated at a temperature of 50 to 100° C., or by a imidization method in which alcohol is removed while refluxing the above solution.

In the chemical imidization method, the imidization catalyst may be pyridine, triethylamine, picoline or quinoline and the like, and in addition, it may be substituted or unsubstituted nitrogen-containing heterocyclic compounds, N-oxide compounds of a nitrogen-containing heterocyclic compound, substituted or unsubstituted amino acid compounds, aromatic hydrocarbon compounds having a hydroxyl group or aromatic heterocyclic compounds. In particular, the catalyst may be imidazole derivatives such as lower alkylimidazoles, for example, 1,2-dimethylimidazole, N-methylimidazole, N-benzyl-2-methylimidazole, 2-methylimidazole, 2-ethyl-4-methylimidazole, 5-methylbenzimidazole and the like; substituted pyridines, for example, isoquinoline, 3,5-dimethylpyridine, 3,4-dimethylpyridine, 2,5-dimethylpyridine, 2,4-dimethylpyridine, 4-n-propylpyridine and the like; p-toluene sulfonic acid and the like.

The dehydrating agent may be an acid anhydride such as acetic acid anhydride.

Alternatively, the imidization may be carried out by coating the polyimide precursor composition on a substrate, followed by heat treatment.

The polyimide precursor composition may be in the form of a solution dissolved in an organic solvent, and in this case, for example, when the polyimide precursor is synthesized in the organic solvent, the solution may be the reaction solution thus obtained itself or a solution obtained by diluting the reaction solution with another solvent. Further, when the polyimide precursor is obtained as solid powder, the solution may be a solution obtained by dissolving the powder in an organic solvent.

The present invention provides a method for preparing a polyimide film comprising coating the polyimide precursor composition on a substrate; and heat-treating the polyimide precursor composition coated on the substrate.

After coating the polyimide precursor composition on a substrate, the composition can be heat-treated in an IR oven or a hot air oven, or on a hot plate, and the heat-treatment for curing may be performed at a temperature ranging from 300 to 500° C., preferably 320 to 480° C., and also may be performed in multi-steps within the above temperature range. The heat-treating process may be performed for 20 min to 70 min, preferably 20 min to 60 min.

The organic solvent contained in the polyimide precursor composition of the present invention may be the same organic solvent used for the above synthesis reaction.

In the present, a coupling agent, a crosslinkable compound, an imidization catalyst for effectively proceeding imidization and the like can be added if they do not have an influence upon the effect of the present invention.

In addition, the polyimide film according to the present invention may have a haze of 2 or less, preferably 1 or less, or 0.9 or less to improve transparency. Also, the polyimide film may have a thickness of 8 to 15 μm, preferably 10 to 12 on.

Further, the polyimide film may be a colorless and transparent, specifically have a transmittance of at least 80% to light at a wavelength of 380 nm to 760 nm within the film thickness of 5 to 30 μm, and a yellowness index (YI) of about 15 or less, preferably about 10 or less, more preferably about 8 or less. Therefore, the polyimide film can exhibit markedly improved transparency and optical properties due to its excellent light transmittance and yellowness index.

Furthermore, the polyimide film may have an in-plane retardation ($R_{in}$) of about 0 to 100 nm and a thickness retardation ($R_{th}$) of about 1000 nm or less, or 0 to 700 nm, preferably 0 to 600 nm, more preferably 0 to 500 nm. When the thickness retardation of the polyimide film satisfies such range, it is possible to develop a visual sensitivity suitable for a display. If the thickness retardation is more than 1000 nm, the polyimide film undergoes retardation therein and light looks distorted, thereby significantly deteriorating the visual sensitivity.

Also, the polyimide film according to the present invention may have a Tg of 350° C. or higher, preferably 360° C. or higher, more preferably 370° C. or higher.

In addition, the polyimide film according to the present invention may have excellent heat resistance on temperature change. For example, the polyimide film according to the present invention may have a coefficient of thermal expansion (CTE) of −10 to 100 ppm/° C., preferably −7 to 90 ppm/° C., more preferably 80 ppm/° C. or less, after heating and then cooling the polyimide film n+1 times in a range from 100 to 400° C.

Other embodiment of the present invention provides an article comprising the polyimide copolymer.

The article may be a film, a fiber, a coating material, an adhesive and the like, but not limited thereto. The article may be formed by a dry/wet method, a dry method, a wet method and the like using a composite composition of the copolymer and inorganic particles, but not limited thereto. Specifically, as described above, the article may be an optical film, and in this case, the composition comprising the polyimide copolymer may be applied on a substrate through a spin coating method followed by being dried and cured to prepare the article easily.

The polyimide according to the present invention can maintain characteristics such as heat resistance, mechanical strength and the like due to its rigid structure, in particular, excellent heat resistance against thermal shrinkage behavior which can occur during a high temperature process. Also, it exhibits excellent colorless and transparent characteristics. Thus, it can be used in various fields such as a substrate for a device, a cover substrate for a display, an optical film, an integrated circuit (IC) package, an adhesive film, a multi-layered flexible printed circuit (FPC), a tape, a touch panel, a protection film for an optical disk and the like.

Another embodiment of the present invention provides a display device comprising the article. Specifically, the display device may be a liquid crystal display device (LCD), an organic light emitting diode (OLED) and the like. In particular, the polyimide may be suitable for an OLED device which uses a LTPS (low temperature polycrystalline silicon) process requiring a high temperature process, but not limited thereto.

Hereinafter, the present invention will be described in more detail with reference to Examples. It will be apparent to those skilled in the art that the following examples are intended to be illustrative of the present invention and not to be construed as limiting the scope of the invention.

Example 1

To a reactor subjected to nitrogen gas flow were filled 164 g of dimethyl propanamide (DMPA, partition coefficient 0.504), and then 0.0017 mol of diphenylsiloxane-dimethyl-siloxane co-oligomer (DMS-DPS, Mw 5000 g/mol) being amine-modified both ends and 0.0518 mol of 2,2'-bis(trifluoromethyl)benzidine (TFMB) were dissolved while maintaining the temperature of the reactor to 25° C. To the solution of DMS-DPS and TFMB, 0.0321 mol of PMDA and 0.0214 mol of 9,9'-bis(3,4-dicarboxyphenyl)fluorene dianhydride (BPAF) were added and stirred for 3 hrs at the same temperature, and then stirred for 4 hrs at 80° C. to obtain a precursor composition.

Figure 2:
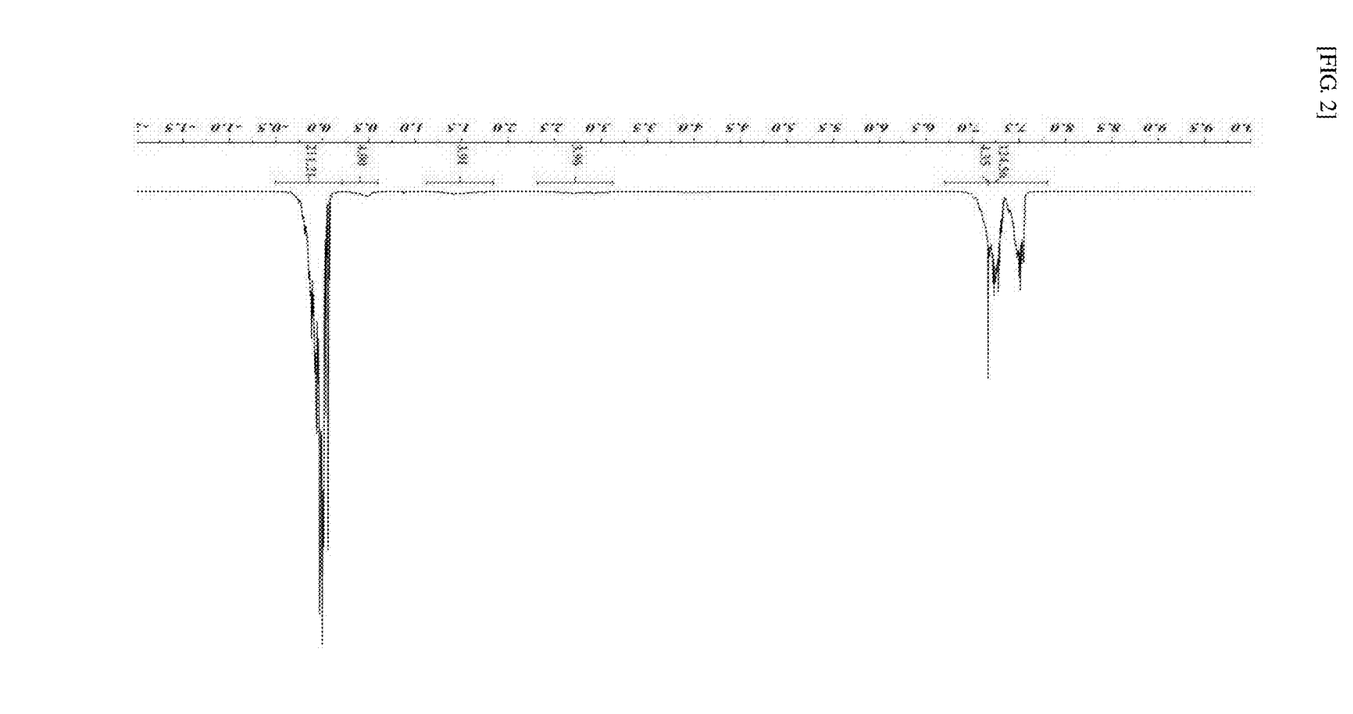
FIG. 2 shows the results of an NMR analysis for the DMS-DPS oligomer used in Example 1.

The DMS-DPS used in Example 1 was subject to an NMR analysis and the results thereof were shown in FIG. 2. In the structure of DMS-DPS represented by Formula 1, p=73.3 and q=26.7.

Example 2

To a reactor subjected to nitrogen gas flow were filled 100 g of diethyl propanamide (DEPA, partition coefficient 1.275), and then 0.0014 mol of DMS-DPS (Mw 5000 g/mol) being amine-modified both ends and 0.0306 mol of 2,2'-bis(trifluoromethyl)benzidine (TFMB) were dissolved while maintaining the temperature of the reactor to 25° C. To the solution of DMS-DPS and TFMB, 0.03211 mol of pyromellitic dianhydride (PMDA) was added and stirred for 3 hrs at the same temperature, and then stirred for 4 hrs at 80° C.

Comparative Example 1

To a reactor subjected to nitrogen gas flow were filled 96 g of N-methylpyrrolidone (NMP, partition coefficient −0.28), and then 0.0017 mol of diphenylsiloxane-dimethyl-siloxane co-oligomer (DMS-DPS, Mw 4400 g/mol, p=95.2, q=4.8) being amine-modified both ends and 0.0304 mol of 2,2'-bis(trifluoromethyl)benzidine (TFMB) were dissolved while maintaining the temperature of the reactor to 25° C. To the solution of DMS-DPS and TFMB, 0.0321 mol of pyromellitic dianhydride (PMDA) was added and stirred for 3 hrs at the same temperature, and then stirred for 4 hrs at 80° C.

Comparative Example 2

To a reactor subjected to nitrogen gas flow were filled 137 g of N-methylpyrrolidone (NMP, partition coefficient −0.28), and then 0.0014 mol of DMS-DPS (Mw 5000 g/mol, p=50.8, q=49.2) being amine-modified both ends and 0.0306 mol of 2,2'-bis(trifluoromethyl)benzidine (TFMB) were dissolved while maintaining the temperature of the reactor to 25° C. To the solution of DMS-DPS and TFMB, 0.03211 mol of pyromellitic dianhydride (PMDA) was added and stirred for 3 hrs at the same temperature, and then stirred for 4 hrs at 80° C.

Experimental Example

Each of the polyimide copolymers obtained in Examples 1 and 2 and Comparative Examples 1 and 2 was spin coated in a thickness of 9.5 to 11 μm onto a glass substrate. The polyimide copolymer-coated glass substrate was put in an oven and subject to heating at a rate of 2° C./min, followed by curing at 80° C. for 15 min, 150° C. for 30 min, 220° C. for 30 min and 400° C. for 1 hr. After curing, the glass substrate was dipped in water, and the film formed on the substrate was detached and dried at 100° C. in an oven, to prepare a polyimide film.

The polyimide film prepared was measured for yellowness index (YI), haze, thickness retardation, CTE, glass transition temperature (Tg) and glass stress (Bow), and the results thereof were shown in Table 1.

<Yellowness Index (YI)>

The yellowness index (YI) of the film was measured using a colorimeter (Color Eye 7000A).

<Haze>

The haze of the film was measured using Haze Meter HM-150 according to the method of ASTM D1003.

<Thickness Retardation>

The thickness retardation ($R_{th}$) of the film was measured using Axoscan. The film was cut into a certain size to give a sample and the thickness of the sample was measured. Then, the retardation of the film was measured using Axoscan and the measured thickness was input while calibrating in the C-plate direction to compensate for the retardation value.

<Coefficient of Thermal Expansion (CTE) and Glass Transition Temperature (Tg)>

The film was cut into a size of 5 mm×20 mm to give a sample, and the sample was loaded thereon using an accessory. The actual measured length of the films was 16 mm, and the force pulling the film was set to 0.02 N. A first heating process was performed within the temperature ranging from 100 to 350° C. at a heating rate of 5° C./min. Then, when the heated sample was subject to cooling within the temperature ranging from 350 to 100° C. at a cooling rate of 4° C./min, the change of thermal expansion was measured with TMA (Q400, TA Instruments). The infection point shown in the temperature range during the first heating process was taken as Tg.

<Glass Stress>

Glass stress was indicated by a value of Bow and measured as follows.

A glass having a size of 10 cm×10 cm was mounted on a stress measurement system (FLX2320, TENCOR). After the center of the glass was scanned with a laser, the height deviation of the glass, i.e., a degree that the glass was warped, was measured at a distance of 4 cm between the left and right sides in the center (a total length of 8 cm) except for 1 cm on both edges of the glass.

TABLE 1

|  | Example 1 | Example 2 | Comparative Example 1 |
|---|---|---|---|
| DMS-DPS Mw | 5000 | 5000 | 5000 |
| p:q | 73.3:26.7 | 73.3:26.7 | 95.2:4.8 |
| Organic Solvent | DMPA | DEPA | NMP |
| DMS-DPS Content (wt %) | 25 | 25 | 25 |
| Molecular Weight of PI | 78000 | 85000 | 53000 |
| Solid Content (wt %) | 15.7 | 14.3 | 16.9 |
| Viscosity (cps) | 3900 | 3800 | 4100 |
| Thickness (μm) | 10 | 10 | 10 |
| YI | 5.8 | 5.9 | 9.6 |
| State of Solution | Uniform | Uniform | Un-uniform (White turbidity) |
| Haze | 0.2 | 0.3 | 46.8 |
| $R_{th}$ | 185 | 185 | 190 |
| CTE (100~350° C., 1st cooling) | 60 | 60 | 120 |
| Tg (° C.) | 400 | 400 | 350 |
| Real Bow (μm) | 24 | 25 | 24 |
| Residual Stress (MPa) | 25 | 24 | 23 |

From Table 1, the polyimide copolymers of Examples 1 to 2 were obtained using DMS-DPS (the moral ratio of DMS block and DPS block is 73.3:26.7) to improve white turbidity in the solution and haze in the film, while that of Comparative Example 1 was obtained from DMS-DPS wherein the DMS block was contained in a high ratio to exhibit white turbidity in the solution and poor haze in the film. Also, Comparative Example 2 used DMS-DPS wherein the DPS block was contained in a relatively high ratio to exhibit high residual stress.

Further, Examples 1 to 2 using a solvent having a positive value of partition coefficient (log P) at 25° C. and a density of 1 g/cm³ or less exhibited improved optical properties and heat resistance as compared with Comparative Example 1.

While the present invention has been particularly shown and described with reference to figures and embodiments thereof, it will be understood by those of ordinary skill in the art that the scope of the present invention is not limited thereby and that various changes and modifications may be made therein. Therefore, the actual scope of the present invention will be defined by the appended claims and their equivalents.

What is claimed is:

1. A polyimide precursor composition, comprising an acid dianhydride, a diamine and a dimethylsiloxane (DMS)-diphenylsiloxane (DPS) oligomer of Formula 1 as polymerization components, and an organic solvent having a positive value of partition coefficient (log P) at 25° C. and a density of 1 g/cm³ or less:

[Formula 1]

wherein, p and q are each a molar fraction, and p ranges from 70 to 90 and q ranges from 10 to 30 when the sum of p and q is 100, wherein the organic solvent is dimethylpropionamide (DMPA) or diethylpropionamide (DEPA), and wherein the dimethylsiloxane (DMS)-diphenylsiloxane (DPS) oligomer has a molecular weight of 4,000 g/mol or more.

2. The polyimide precursor composition of claim 1, wherein the acid dianhydride is at least one selected from tetracarboxylic dianhydrides containing a tetravalent organic group of Formulas 2a to 2h:

[Formula 2a]

[Formula 2b]

[Formula 2c]

[Formula 2d]

[Formula 2e]

[Formula 2f]

-continued

[Formula 2g]

[Formula 2h]

wherein,
R$_{11}$ to R$_{24}$ are each independently a substituent selected from a group of —F, —Cl, —Br, —I, hydroxyl (—OH), thiol (—SH), nitro (—NO$_2$), cyano, C$_{1-10}$ alkyl, C$_{1-4}$ halogenoalkoxyl, C$_{1-10}$ halogenoalkyl, and C$_{6-20}$ aryl,
a1 is an integer of 0 to 2, a2 is an integer of 0 to 4, a3 is an integer of 0 to 8, a4 and a5 are each independently an integer of 0 to 3, and a7 and a8 are each independently an integer of 0 to 3, a10 and a12 are each independently an integer of 0 to 3, a11 is an integer of 0 to 4, a15 and a16 are each independently an integer of 0 to 4, a17 and a18 are each independently an integer of 0 to 4, and a6, a9, a13, a14, a19 and a20 are each independently an integer of 0 to 3,
n is an integer of 1 to 3, and
A$_{11}$ to A$_{16}$ are each independently selected from the group consisting of —O—, —CR'R"—, —C(=O)—, —C(=O)O—, —C(=O)NH—, —S—, —SO$_2$—, phenylene and a mixture thereof, in which R' and R" are each independently selected from the group consisting of hydrogen, C$_{1-10}$ alkyl, and C$_{1-10}$ fluoroalkyl.

3. The polyimide precursor composition of claim 1, wherein the diamine comprises a compound having the structure of Formula 3 in an amount of 80 to 99 mol %, based on the total amount of the diamine:

[Formula 3]

wherein,
R$_{31}$ and R$_{32}$ are each independently a substituent selected from the group of —F, —Cl, —Br, —I, hydroxyl (—OH), thiol (—SH), nitro (—NO$_2$), cyano, C$_{1-10}$ alkyl, C$_{1-4}$ halogenoalkoxyl, C$_{1-10}$ halogenoalkyl, and C$_{6-20}$ aryl, and
Q is selected from the group consisting of a single bond, —O—, —CR'R"—, —C(=O)—, —C(=O)O—, —C(=O) NH—, —S—, —SO$_2$—, phenylene and a mixture thereof, in which R' and R" are each independently selected from the group consisting of hydrogen, C$_{1-10}$ alkyl, and C$_{1-10}$ fluoroalkyl.

4. The polyimide precursor composition of claim 1, wherein the acid dianhydride is a tetracarboxylic dianhydride comprising a compound having the structure of Formula 4 in an amount of 20 to 80 mol %, based on the total amount of the tetracarboxylic dianhydride:

[Formula 4]

5. The polyimide precursor composition of claim 1, wherein the acid dianhydride is a tetracarboxylic dianhydride comprising a compound having the structure of Formula 5 in an amount of 20 to 80 mol %, based on the total amount of the tetracarboxylic dianhydride:

[Formula 5]

wherein, Q$_1$ and Q$_2$ are each independently selected from the group consisting of a single bond, —O—, —C(=O)—, —C(=O)O—, —C(=O)NH—, —S—, —SO$_2$—, phenylene and a mixture thereof.

6. The polyimide precursor composition of claim 1, wherein the acid dianhydride comprises both tetracarboxylic dianhydrides of Formula 4 and Formula 5:

[Formula 4]

[Formula 5]

wherein, Q$_1$ and Q$_2$ are each independently selected from the group consisting of a single bond, —O—, —C(=O)—, —C(=O)O—, —C(=O)NH—, —S—, —SO$_2$—, phenylene and a mixture thereof.

7. A polyimide film prepared from the polyimide precursor composition of claim 1.

8. The polyimide film of claim 7, which has a haze of 2 or less.

9. The polyimide film of claim 7, which has a Tg of 350° C. or higher.

10. The polyimide film of claim 7, which has a CTE of 100 ppm/° C. or less.

11. An oxide TFT comprising a transparent polyimide substrate including the polyimide film of claim 7.

12. An LTPS comprising a transparent polyimide substrate including the polyimide film of claim 7.

* * * * *